United States Patent
Baldwin et al.

[11] Patent Number: 6,134,120
[45] Date of Patent: Oct. 17, 2000

[54] LOW PROFILE CIRCUIT BOARD MOUNTING ARRANGEMENT

[75] Inventors: Joe M. Baldwin, Clarksville, Tenn.; Dale C. Cotton, Franklin, Tex.; Bruce D. Smalling, Clarksville, Tenn.

[73] Assignee: American Standard Inc., Piscataway, N.J.

[21] Appl. No.: 09/146,779

[22] Filed: Sep. 4, 1998

[51] Int. Cl.⁷ .................................................. H05K 1/14
[52] U.S. Cl. .......................... 361/804; 361/792; 361/796; 361/801; 361/802; 174/255; 174/52.1; 211/41.17; 439/61; 439/64
[58] Field of Search ............................... 361/804, 792, 361/796, 801, 802, 742; 174/255, 52.1; 211/41.17; 439/64, 62, 636, 629, 61

[56] References Cited

U.S. PATENT DOCUMENTS

| | | |
|---|---|---|
| 4,319,305 | 3/1982 | Meldrum .............................. 361/796 |
| 4,473,263 | 9/1984 | Sunstein ................................ 439/64 |
| 4,756,694 | 7/1988 | Billman et al. ......................... 439/61 |
| 5,227,664 | 7/1993 | Toshio et al. ........................ 257/723 |
| 5,552,965 | 9/1996 | Habegger ............................. 361/801 |

*Primary Examiner*—Jeffrey Gaffin
*Assistant Examiner*—David Foster
*Attorney, Agent, or Firm*—William J. Beres; William O'Driscoll; Peter D. Ferguson

[57] ABSTRACT

A board mount assembly. The assembly comprises a panel, a board mount and a circuit board. The panel is generally arranged in a plane. The board mount has an attachment portion operably connected to the panel and parallel thereto, and has a support portion extending from the first portion at a non-perpendicular angle relative to the plane of the panel. The circuit board has a first standoff engaged with the board mount.

20 Claims, 2 Drawing Sheets

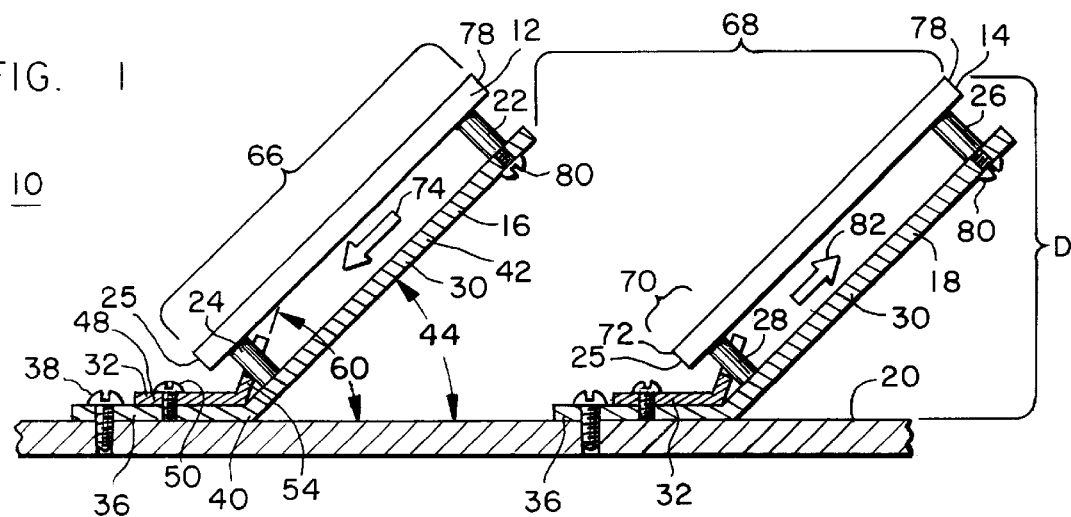
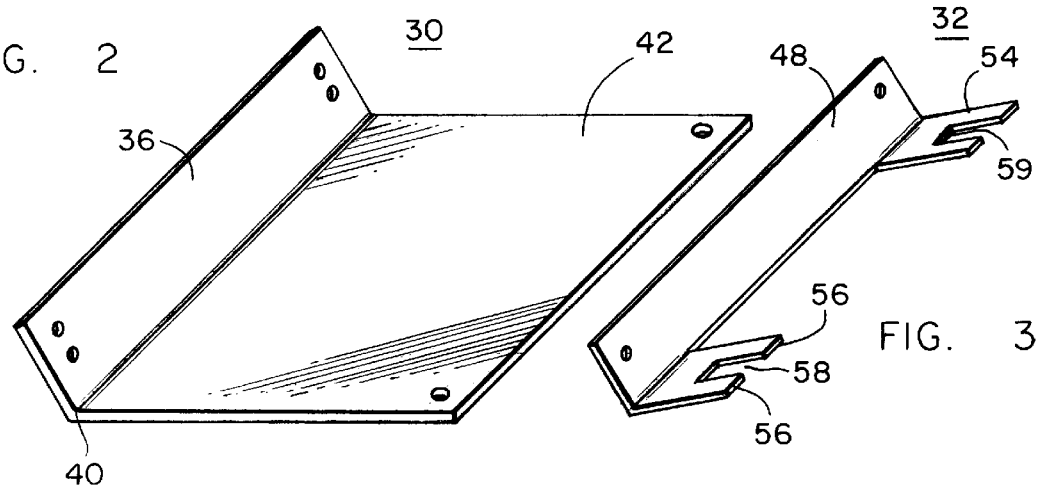
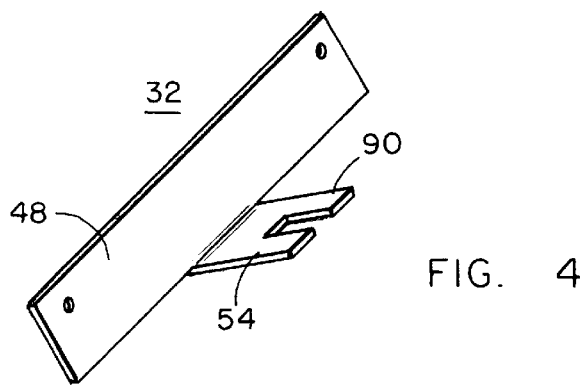

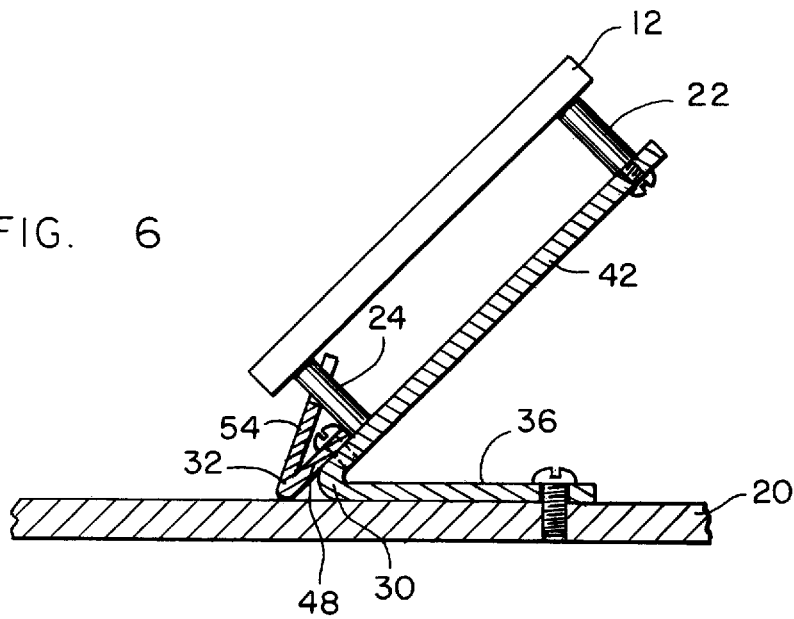
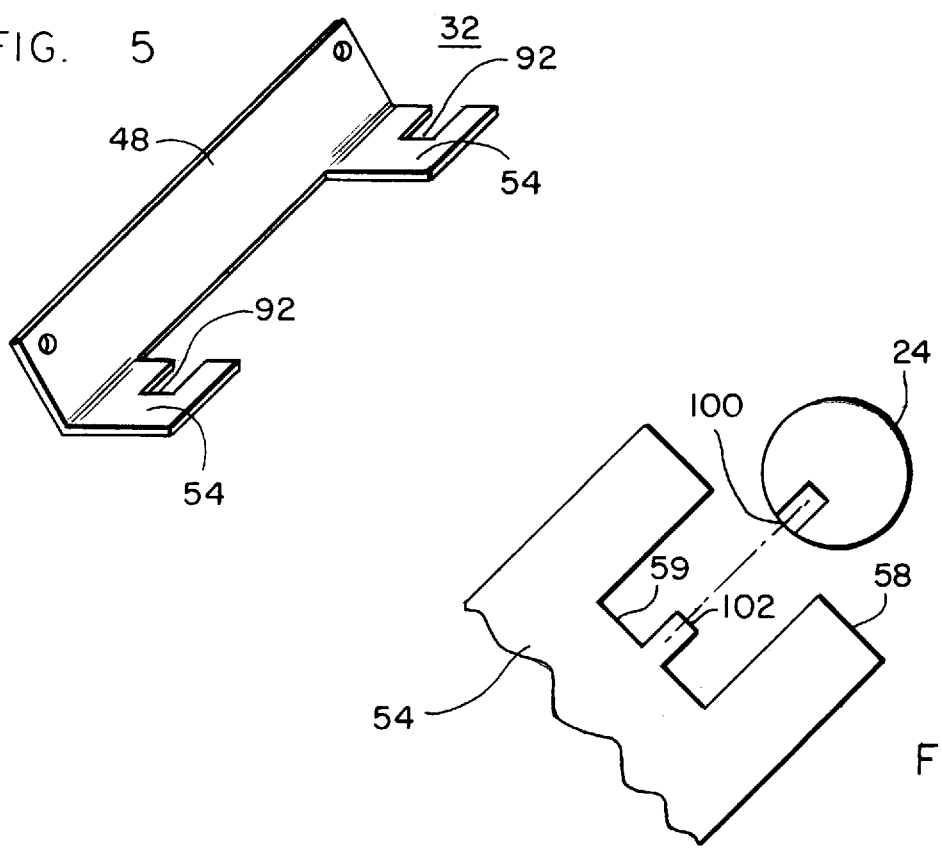

LOW PROFILE CIRCUIT BOARD MOUNTING ARRANGEMENT

BACKGROUND OF THE INVENTION

The present invention is directed to minimizing the amount of space used by controller housings, particularly in packaged or rooftop air conditioning systems, while providing access to test points on the circuit boards in the housing.

Typically, the controller includes circuit boards arranged in a protective box or housing which in turn is located at a convenient location within the air conditioning system, or hanging on the outside of the system at a convenient location. In either case, a convenient location can result in the control box obstructing either airflow or access.

It would be desirable to minimize the depth of the control box while allowing access to test points on the circuit boards for serviceability.

SUMMARY OF THE INVENTION

It is an object, feature and advantage of the present invention to solve the problems of the prior art circuit board mounting assemblies.

It is an object, feature and advantage of the present invention to provide a circuit board mount which is angled so that the overall depth of a surrounding box is reduced.

It is an object, feature and advantage of the present invention to allow access to test points on the circuit board where those test points are located towards the outer end of the circuit board.

It is an object, feature and advantage of the present invention to provide a circuit board mounting arrangement which avoids the necessity of fastening interior circuit board standoffs with a screw or similar device.

It is an object, feature and advantage of the present invention to provide a board mount which allows the nesting of circuit boards while still minimizing the overall depth of the surrounding housing and allowing access to test points.

The present invention provides a board mount assembly. The assembly comprises a panel, a board mount, and a circuit board. The panel is generally arranged in a plane. The board mount has an attachment portion operably connected to the panel and parallel thereto, and has a support portion extending from the first portion at a non-perpendicular angle relative to the plane of the panel. The circuit board has a first standoff engaged with the board mount. The assembly also comprises a second standoff at an inner end of the circuit board and further includes a retainer connected to the board mount and having a centering portion operatively engaged with the second standoff.

The present invention also provides a board mount assembly for mounting a circuit board to a panel. The assembly comprises a support bracket having a support portion and an attachment portion, and a retainer. The support bracket is angled at a first angle between the support portion and the attachment portion. The retainer has a base portion engaged with the attachment portion and has a clip portion extending from the base portion over the support portion at a second angle greater than the first angle.

The present invention further provides a method of attaching a circuit board to a panel. The method comprises the steps of: forming a panel; forming a circuit board; forming a board mount having a support portion and an attachment portion where the attachment portion is angled from the support portion at a first angle; attaching the attachment portion to the panel such that the support portion extends from the panel at the first angle; forming a retainer having base portion and at least one clip portion angled from the base portion at a second angle greater than the first angle; attaching the base portion to the attachment portion such that the clip portion overlies the support portion; engaging the circuit board to the clip portion; and fastening the circuit board to the board mount.

BRIEF DESCRIPTION OF THE DRAWINGS

FIG. 1 shows a circuit board, panel and mounting arrangement in accordance with the present invention including a board mount and a retainer.

FIG. 2 shows the board mount of FIG. 1 in perspective view.

FIG. 3 shows the retainer of FIG. 1 in perspective view.

FIG. 4 is an alternative embodiment of the retainer of FIG. 3 for use with a circuit board having a single center mounted standoff on its interior end.

FIG. 5 is an alternative embodiment of the retainer of FIG. 3 showing a retainer with a side opening.

FIG. 6 is an alternative embodiment of the board mount and retainer angled at acute rather than obtuse angles.

FIG. 7 is a further alternative embodiment of the present invention.

DETAILED DESCRIPTION OF THE DRAWINGS

The present invention is directed to circuit board mounting arrangements particularly for use in packaged air conditioning units but also generally applicable to other controller applications. For purposes of this application, packaged air conditioning units have a controller box and include rooftop air conditioning units such as shown in commonly assigned U.S. Pat. No. 5,533,348 to Baldwin et al. which is hereby incorporated by reference. The invention is also applicable to the various controllers used in air conditioning systems and elsewhere such as shown for example in U.S. Pat. No. 5,224,648 to Simon, deceased et al., this patent being commonly assigned with the present invention and incorporated by reference herein. Additionally, exemplary controllers for which the present invention would be suitable are sold by The Trane Company, a Division of American Standard Inc., under the trademarks UCP3, TUC, PCM and Tracer. Details of the circuit boards are not shown. For purposes of the present invention, the drawings herein are exemplary and not drawn to scale.

Now referring to FIG. 1, a board mount arrangement 10 in accordance with the present invention is shown. The board mount arrangement 10 includes circuit boards 12, 14, board mounts 16, 18 and a generally planar panel 20 to which the board mounts 16, 18 are conventionally attached. The circuit board 12 includes a standoff 22 at an outer end 78 and a standoff 24 at an inner end 25. The circuit board 12 also includes additional standoffs (not shown) located in each corner of the circuit board 12. Similarly, the circuit board 14 includes an outer standoff 26 located at the outer end 78 and an inner standoff 28 located at the inner end 25. Other standoffs (not shown) are located at each corner of the circuit board 14.

Each board mount 16, 18 comprises a support bracket 30 and a retainer clip 32. Each support bracket 30 includes an attachment portion 36 conventionally attached to the underlying panel 20 such as by screws 38, other fastening devices, or other fastening techniques such as soldering. The attachment portion 36 is joined at a pivot point 40 to a planar support portion 42 which angles from the panel 20 at a first angle 44. The first angle 44 of the support portion 42 is acute relative to the panel 20 but is obtuse relative to the attachment portion 36. The first angle has been empirically determined to range between 90 degrees and 30 degrees, with a preferred angle of 45 degrees.

The retainer 32 includes a base 48 aligned with and fastened to the attachment portion 36 in a conventional manner such as by screws 50, a fastener, or a fastener technique. Particularly referencing FIG. 3, the retainer 32 includes a clip portion 54 having tines 56 arranged to form a gap 58. The gap 58 is sized so that the tines 56 engage the inner standoff 24 with a slight interference fit to position and maintain the standoff 24. Additionally, a trough 59 in the gap 58 interferingly engages the standoff 24 and exerts a tension against the standoff 24 in the direction indicated by arrow 82. The retainer clip 54 is angled at a second angle 60 steeper than the first angle 44 but still acute relative to the panel 20 and obtuse relative to the base 48. The second angle has been empirically determined to range between the first angle and 90 degrees with a preferred angle of 50 to 60 degrees.

As shown in FIG. 1, the use of multiple board mounts 16, 18 allows circuit boards 12, 14 to be nested. In the nested arrangement, the full face of circuit board 12 is exposed for testing as indicated by a bracket 66 while the exterior end 78 of the circuit board 14 is open for access to testing points as indicated by a bracket 68. Only an interior portion 70 of the circuit board 14 is not directly accessible, but the use of the retainer 32 makes it unnecessary to remove the circuit board 12 and mounting arrangement 30 in order to obtain access to the inner end 25 of circuit board 14.

The assembly of the circuit board is discussed as follows with regard to circuit board 12. The circuit board 12 is moved parallel to the board mount assembly 16 in the direction shown by arrow 74 of FIG. 1 until the standoff 24 of the circuit board 12 engages the clip 54. Preferably, the clip 54 is engaged in a positive manner in direction 74 so as to cause a spring force to be exerted by the clip 54 in the opposite direction (indicated by arrow 82). When the standoff 22 at the exterior end 78 of the circuit board 12 is fastened to the support portion 42 by a conventional fastener such as a screw 80, the screw 80 and the clip 54 positively hold the circuit board 12 in place.

Removing a circuit board from the board assembly is described with regard to circuit board 14 and FIG. 1. The fastener 80 is removed and the circuit board 14 is moved in a direction parallel to the board mount assembly 18 but away from the clip 54 as evidenced by arrow 82. It is unnecessary to access the interior standoff 28 and is unnecessary to remove other boards and board mounts nested around the circuit board 14.

FIG. 4 shows an alternative embodiment of the present invention where the retainer 32 has a similar base 48 but a single center mount clip 90 adapted to engage a single standoff on a circuit board.

FIG. 5 illustrates a further alternative embodiment of the retainer where the clip 54 has a gap 92 which opens to the side. In this alternative embodiment, the circuit board must be installed with a terminal sideways movement and disengaged with an initial sideways movement but otherwise operates similarly to the previously discussed embodiments.

FIG. 6 illustrates a further alternative embodiment where the angles between the retainer base 48 and retainer clip 54 are acute and the angles between the support bracket 52 and attachment portion 36 are also acute.

FIG. 7 is an alternative embodiment where the inner standoff 24 includes an aperture 100 and the retainer clip 54 includes a pin 102 in the trough 59 of the gap 58. The pin 102 is arranged to penetrate the aperture 100 during assembly and lock the retainer clip 54 to the inner standoff 24.

What has been shown is a board mount assembly for a circuit board which has a reduced profile while allowing access to the outer end of the board for test purposes. The board mount assembly allows nested circuit boards and provides an easy attachment arrangement for interior circuit board standoffs. The dimension of first angle 44 reduces the depth D of the overall arrangement allowing a smaller housing and thereby a reduced profile. It will be apparent to a person of ordinary skill in the art that many modifications and alterations of this arrangement can be made. The inner standoff 24 may have a slot into which the tines 56 fit, or the tines 56 may snap fit around the standoff. Additionally, the inner standoff 24 can have an aperture 100 which engages a pin 102 extending from the center of the trough. Also, the inner standoff 24 can be eliminated in favor of a clasp or money clip arrangement on the end of the retainer which engages the inner end 25 of the circuit board and maintains it in place. All such modifications and alterations are intended to fall within the spirit and scope of the claimed invention.

What is desired to be secured for Letters Patent of the United States is as follows:

1. A board mount assembly comprising:

a panel generally arranged in a plane;

a board mount having an attachment portion operably connected to the panel and parallel thereto, and having a support portion extending from the first portion at a first non-perpendicular angle relative to the plane of the panel; and a circuit board having a first standoff engaged with the board mount.

2. The assembly of claim 1 the circuit board including a second standoff at an inner end and further including a retainer connected to the board mount and having a centering portion operatively engaged with the second standoff.

3. The assembly of claim 2 wherein the centering portion is angled at a second angle steeper than the first angle relative to the plane.

4. The assembly of claim 3 wherein the first angle is an obtuse angle.

5. The assembly of claim 3 wherein the first angle is an acute angle.

6. The assembly of claim 5 wherein the retainer is snap fit to the second standoff.

7. The assembly of claim 5 wherein the retainer clips includes a pin, the second standoff includes an aperture, and the pin engages the aperture.

8. The assembly of claim 5 wherein the first angle ranges between 90 degrees and 30 degrees relative to the plane.

9. The assembly of claim 8 wherein the first angle is approximately 45 degrees.

10. The assembly of claim 5 wherein the second angle ranges between the first angle and 90 degrees relative to the plane.

11. The assembly of claim 10 wherein the second angle is approximately 50 to 60 degrees.

12. A board mount assembly for mounting a circuit board to a panel comprising:

a support bracket having a support portion and an attachment portion;

the support bracket being angled at a first angle between the support portion and the attachment portion.

13. The board mount of claim 12 further including a retainer having a base portion engaged with the attachment portion and having a clip portion extending from the base portion over the support portion at a second angle greater than the first angle.

14. The board mount of claim 13 wherein the clip portion includes tines arranged to form a gap.

15. The board mount of claim 14 wherein the gap includes a pin.

16. The board mount of claim 15 wherein the first angle is approximately 45 degrees, and the second angle is greater than the first angle.

17. A method of attaching a circuit board to a panel comprising the steps of:

forming a panel;

forming a circuit board;

forming a board mount having a support portion and an attachment portion where the attachment portion is angled from the support portion at a first angle;

attaching the attachment portion to the panel such that the support portion extends from the panel at the first angle;

forming a retainer having base portion and at least one clip portion angled from the base portion at a second angle greater than the first angle;

attaching the base portion to the attachment portion such that the clip portion overlies the support portion;

engaging the circuit board to the clip portion; and fastening the circuit board to the board mount.

18. The method of claim 17 wherein the first angle is approximately 45 degrees.

19. The method of claim 17 wherein the step of forming a retainer includes the steps of positioning tines on an end of the retainer so as to form a gap.

20. The method of claim 19 wherein the circuit board includes a standoff and wherein the tines engage the standoff in the gap.

* * * * *

UNITED STATES PATENT AND TRADEMARK OFFICE
CERTIFICATE OF CORRECTION

PATENT NO : 6,134,120
DATED : October 17, 2000
INVENTOR(S): Joe M. Baldwin, Dale C. Cotton and Bruce D. Smalling It is certified that error appears in the above-identified patent and that said Letters Patent are hereby corrected as shown below:

In The Specification:

Column 3, Line 28, "14" should read --15--.

Signed and Sealed this

Eighth Day of May, 2001

Attest:

NICHOLAS P. GODICI

Attesting Officer        Acting Director of the United States Patent and Trademark Office